United States Patent
Brick

(10) Patent No.: US 7,573,927 B2
(45) Date of Patent: Aug. 11, 2009

(54) SEMICONDUCTOR LASER WITH REDUCED HEAT LOSS

(75) Inventor: Peter Brick, Regensburg (DE)

(73) Assignee: Osram Opto Semiconductors GmbH, Regensburg (DE)

(*) Notice: Subject to any disclaimer, the term of this patent is extended or adjusted under 35 U.S.C. 154(b) by 0 days.

(21) Appl. No.: 12/080,378

(22) Filed: Apr. 1, 2008

(65) Prior Publication Data

US 2008/0192784 A1   Aug. 14, 2008

Related U.S. Application Data

(62) Division of application No. 10/926,465, filed on Aug. 25, 2004, now Pat. No. 7,356,062.

(30) Foreign Application Priority Data

Aug. 29, 2003  (DE)  ................ 103 39 980

(51) Int. Cl.
*H01S 5/00* (2006.01)
(52) U.S. Cl. .................. 372/46.014; 372/46.013; 372/46.015
(58) Field of Classification Search ............ 372/46.013, 372/46.014, 46.015
See application file for complete search history.

(56) References Cited

U.S. PATENT DOCUMENTS

| | | | |
|---|---|---|---|
| 5,420,880 A | 5/1995 | Tabatabaie et al. | |
| 5,991,318 A | 11/1999 | Caprara et al. | |
| 6,285,702 B1 | 9/2001 | Caprara et al. | |
| 6,347,109 B1 | 2/2002 | Beach et al. | |
| 6,404,797 B1 | 6/2002 | Mooradian | |
| 6,438,153 B1 | 8/2002 | Caprara et al. | |
| 6,669,367 B2 | 12/2003 | Lin et al. | |
| 6,747,789 B2 | 6/2004 | Huonker et al. | |
| 6,775,310 B2 | 8/2004 | Sai et al. | |

(Continued)

FOREIGN PATENT DOCUMENTS

DE    102 23 879    12/2003

(Continued)

OTHER PUBLICATIONS

Kuznetsov et al. "Design and Characteristics of High-Power (>0.5-W CW) Diode-Pumped Vertical-External-Cavity Surface-Emitting Semiconductor Lasers with Circular $TEM_{00}$ Beams", IEEE Journal of Selected Topics in Quantum Electronics, vol. 5 No. 3, pp. 561-573, May/Jun. 1999.

(Continued)

*Primary Examiner*—Armando Rodriguez
(74) *Attorney, Agent, or Firm*—Cohen Pontani Lieberman & Pavane LLP

(57) ABSTRACT

Disclosed is a semiconductor laser. The semiconductor laser includes a semiconductor chip that includes an active layer and emits radiation in a main radiating direction. The active layer is structured in a direction perpendicular to the main radiating direction to reduce heating of the semiconductor chip by spontaneously emitted radiation. The active layer includes a region provided for optical pumping by a pump radiation source. The optically pumped region of the active layer is surrounded by a region having, in a direction perpendicular to the main radiating direction, a periodic structure that forms a photonic crystal in which radiation having the emission wavelength is not capable of propagation.

9 Claims, 4 Drawing Sheets

U.S. PATENT DOCUMENTS

2002/0167984 A1 11/2002 Scherer
2005/0152415 A1 7/2005 Giesen et al.

FOREIGN PATENT DOCUMENTS

| EP | 1 220 392 A2 | 7/2002 |
|---|---|---|
| JP | 10284806 A | 10/1988 |
| JP | 11186657 A | 7/1999 |
| WO | WO 98/43329 | 10/1998 |
| WO | WO 01/93386 A1 | 12/2001 |
| WO | WO 02/05398 A1 | 1/2002 |

OTHER PUBLICATIONS

Krauss et al. "Photonic crystals in the optical regime—past, present and future", Progress in Quantum Electronics 23 (1999) pp. 51-96.

Hanamaki et al. "Spontaneous emission alteration in InGaAs/GaAs vertical cavity surface emitting laser (VCSEL) structures", Semiconductor Sci. Technol. 14 (1999), pp. 797-803.

Yokouchi et al., "Etching depth dependence of the effective refractive index in two-dimensional photonic-crystal-patterned vertical-cavity surface-emitting laser structures", Applied Physics Letters, vol. 82, No. 9, Mar. 3, 2003, pp. 1344-1346.

Song et al. "Single-fundamental-mode photonic-crystal vertical-cavity surface-emitting lasers", Applied Physics Letters, vol. 80, No. 21, May 27, 2002, pp. 3901-3903.

Summers et al. "Spontaneous emission control in quantum well laser diodes", Optics Express, vol. 2, No. 4, Feb. 16, 1998, pp. 151-156.

Brick et al., "High-efficiency high-power semiconductor disc laser", OSRAM Opto Semiconductors GmbH, Proc. SPIE 4993, (2003) pp. 151-156.

E.M. Purcell, "Spontaneous Emission Probabilities at Radio Frequencies", American Physical Society, Physical Reviews, No. 69, 1949, p. 681.

Slusher et al. "Optical microcavities in condensed matter systems", Solid State Communications (1994) vol. 92, No. 1-2, pp. 149-158.

Jordan et al., "Efficiency enhancement of microcavity organic light emitting diodes", Applied Physics Letter, vol. 69, No. 14, Sep. 30, 1996, pp. 1997-1999.

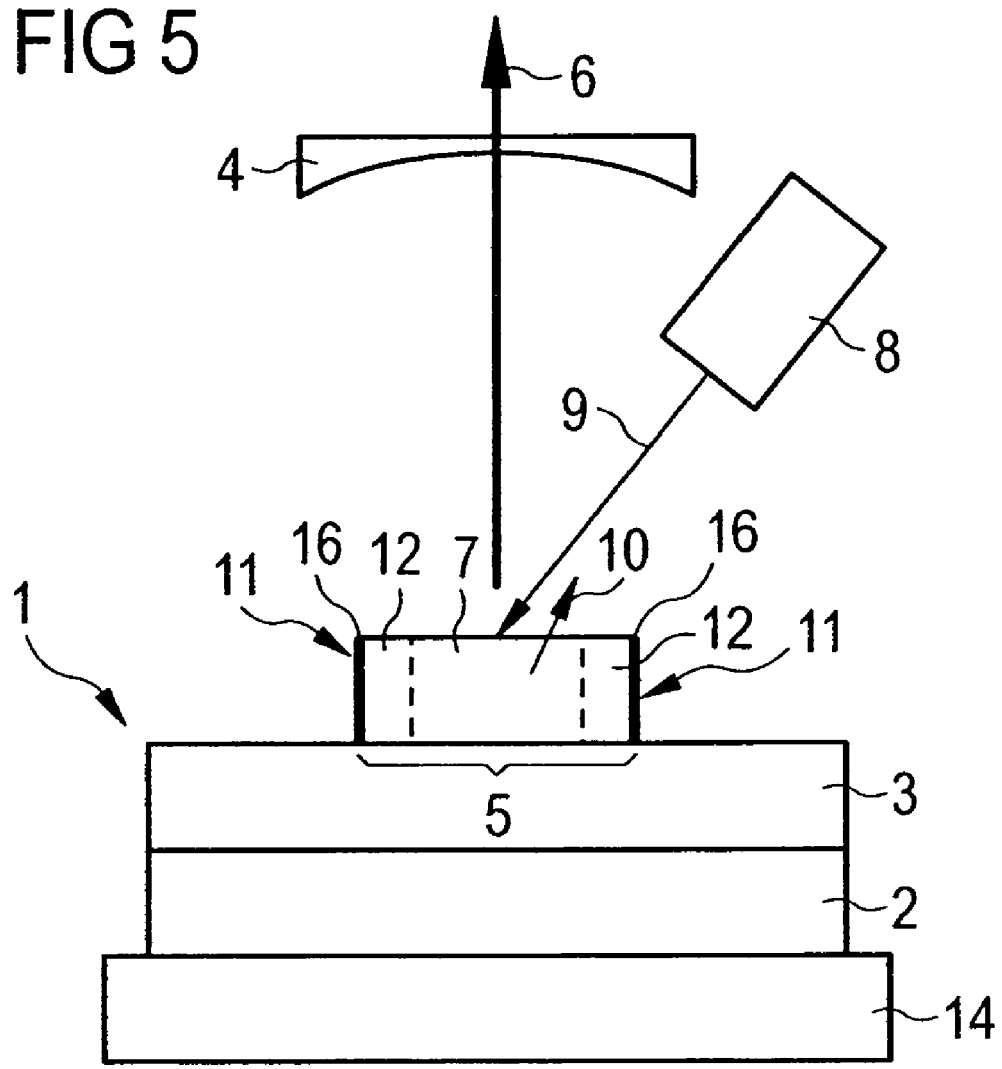

SEMICONDUCTOR LASER WITH REDUCED HEAT LOSS

RELATED APPLICATIONS

This patent application claims the priority of German Patent Application 103 39 980.1-54 filed Aug. 29, 2003, and is a Division of U.S. patent application Ser. No. 10/926,465 filed Aug. 25, 2004 now U.S. Pat. No. 7,356,062, the disclosures of which are hereby incorporated by reference.

FIELD OF THE INVENTION

The invention relates to a semiconductor laser having a semiconductor chip which contains an active layer and emits radiation in a main radiating direction.

BACKGROUND OF THE INVENTION

The efficiency and output power of semiconductor lasers are crucially limited by the heat arising as a result of radiative and non-radiative recombinations of the injected charge carriers.

In order to improve the heat dissipation, optoelectronic components are often provided with a heat sink. In this case, the temperature increase $\Delta T$ in the active zone is given by $\Delta T = R_{th} \cdot P_v$, where $R_{th}$ is the thermal resistance between the active zone and the heat sink and $P_v$ is the power loss. A temperature increase generally brings about a lower amplification in the case of a semiconductor laser. In order to reduce such a temperature increase which is disadvantageous for the efficiency of the semiconductor laser, it is advantageous to reduce the thermal resistance $R_{th}$ or the power loss $P_v$.

By way of example, Kusznetsov et. Al., IEEE Journ. Sel. Topics in Quantum Electronics 5 (3), 561 (1999) discloses improving the thermal linking of the heat sink to the active zone by removal of a substrate that is typically arranged between the active zone and the heat sink. The thermal resistance $R_{th}$ and the temperature increase $\Delta T$ are thereby reduced.

The power loss $P_v$ arising within the active layer is crucially determined by the non-radiative recombination of charge carriers by means of defects or by means of Auger processes, and by radiative recombinations of charge carriers by spontaneous emission. A high recombination rate leads to a short lifetime of the induced charge carriers and thus to a high laser threshold, a low efficiency and output power. It is desirable, therefore, to minimize these types of recombination of charge carriers. The non-radiative recombination of charge carriers by means of defects can be influenced by the quality of the epitaxy. By contrast, the non-radiative recombination of charge carriers by means of Auger processes is difficult to influence.

The spontaneous emission of radiation can be influenced by structures of the order of magnitude of the light wavelength, for example by microresonators or photonic crystals. A detailed presentation of the mode of operation and the methods for production of photonic crystals is contained in the document T. F. Krauss, R. M. De La Rue, Prog. Quant. Electr. 23 (1999) 51-96, the content of which is hereby incorporated by reference.

The influencing of the spontaneous emission by a microresonator is disclosed in the document Y. Hanamaki, H. Akiyama, Y. Shiraki, Semicond. Sci. Technol. 14 (1999) 797-803. U.S. Pat. No. 5,420,880 describes reducing the laser threshold of a surface-emitting semiconductor laser by means of reducing the coupling-out of spontaneously emitted radiation.

Furthermore, WO 98/43329 discloses a vertically emitting laser in which the radiation emitted spontaneously or in stimulated fashion from a first volume region of an active medium in a transverse direction is utilized for pumping a second volume region surrounding the first volume region.

SUMMARY OF THE INVENTION

One object of the present invention is to provide a semiconductor laser having a comparatively small degree of heating during operation.

One aspect of the invention is directed to a semiconductor laser that includes a semiconductor chip that includes an active layer and emits radiation in a main radiating direction. The active layer is structured in a direction perpendicular to the main radiating direction to reduce heating of the semiconductor chip by spontaneously emitted radiation. The active layer includes a region provided for optical pumping by a pump radiation source. The optically pumped region of the active layer is surrounded by a region having, in a direction perpendicular to the main radiating direction, a periodic structure that forms a photonic crystal in which radiation having the emission wavelength is not capable of propagation.

In one embodiment, the semiconductor laser is a disc laser, and the disc laser has an external resonator. In another embodiment, the active layer has the form of a mesa. In still another embodiment, In yet another embodiment, the active layer has the form of a mesa, and the width of the mesa in a direction perpendicular to the main radiating direction of the semiconductor laser is approximately as large as the width of the optically pumped region.

In another embodiment, the periodic structure is formed by a lattice-type arrangement of cutouts, and the cutouts are filled by a material whose refractive index differs from that of the active layer.

In still another embodiment, the laser contains a heat sink, and no substrate is contained between the heat sink and the active layer.

BRIEF DESCRIPTION OF THE DRAWINGS

FIG. 5 shows a first example of the second embodiment of a semiconductor laser according to the invention.

DETAILED DESCRIPTION OF THE PREFERRED EMBODIMENTS

Identical or identically acting elements are provided with the same reference symbols in the figures.

Figure 1:
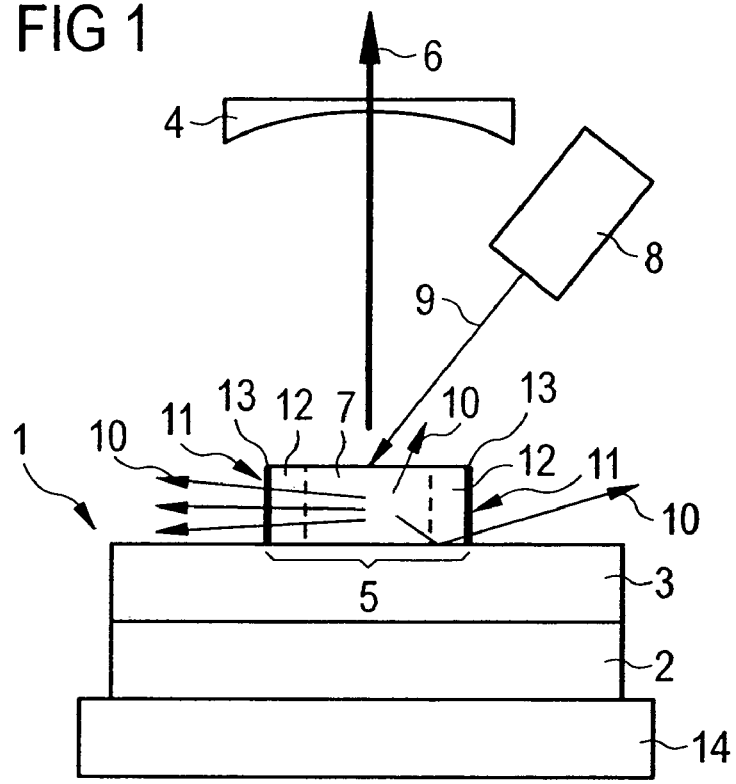
FIG. 1 shows a diagrammatic illustration of a cross section through a first example of a first embodiment of a semiconductor laser according to the invention.

The semiconductor laser illustrated in FIG. 1 is a surface-emitting optically pumped semiconductor laser with an external resonator (VECSEL). The semiconductor laser has a semiconductor chip 1 containing a substrate 2, a reflector 3, and an active layer 5. The reflector 3, which is preferably a Bragg reflector, forms, together with an external reflector 4, the resonator of the semiconductor laser. The semiconductor laser emits radiation in the main radiating direction 6.

The active layer 5 may, for example, have a quantum well structure and contain in particular III-V compound semiconductor materials. A region 7 of the active layer 5 is optically pumped by a pump radiation source 8. The active layer 5 has the form of a mesa. In a direction perpendicular to the main radiating direction 6 of the semiconductor laser, the mesa has a smaller cross section than the rest of the semiconductor chip 1. The mesa structure is produced for example by means of a photolithographic patterning and a subsequent etching process.

Radiation 10 that is spontaneously emitted within the region 7, into which the pump radiation source 8 radiates pump radiation 9, and propagates in the direction of the side walls 11 of the mesa reaches the side walls 11 after a comparatively short path through regions 12 of the active layer 5 that are not optically pumped and therefore absorb. Within the optically pumped region 7, by contrast, spontaneously emitted radiation 10 can propagate in a manner virtually free of absorption, since a population inversion is present there on account of the pump process. The shape of the active layer 5 as a mesa structure reduces the non-inverted regions 12 in a direction perpendicular to the main radiating direction, so that the absorption of spontaneously emitted radiation is advantageously reduced in these regions 12.

Particularly preferably, the mesa is approximately as wide as the optically pumped region 7 in a direction perpendicular to the main radiating direction 6. The width of the non-inverted regions 12 that can absorb spontaneously emitted radiation 10 is therefore reduced to a minimum.

In order to further improve the coupling-out of spontaneously emitted radiation 10 from the semiconductor chip 1, the side walls 11 of the mesa are advantageously provided with an antireflective layer 13. This reduces the back-reflection on account of the difference in refractive index of the active layer 5 with respect to the surroundings.

The reduced absorption of spontaneously emitted radiation 10 reduces the thermal loading on the semiconductor laser. In order to better dissipate heat loss that occurs nevertheless, the semiconductor laser may furthermore contain a heat sink 14. By way of example, the semiconductor chip 1 may be mounted onto the heat sink 14 by the rear side of the semiconductor substrate 2. The thermal resistance between the active layer 5 and the heat sink 14 may advantageously be reduced by removing the substrate 2. Such a semiconductor laser is illustrated in FIG. 2.

Figure 2:
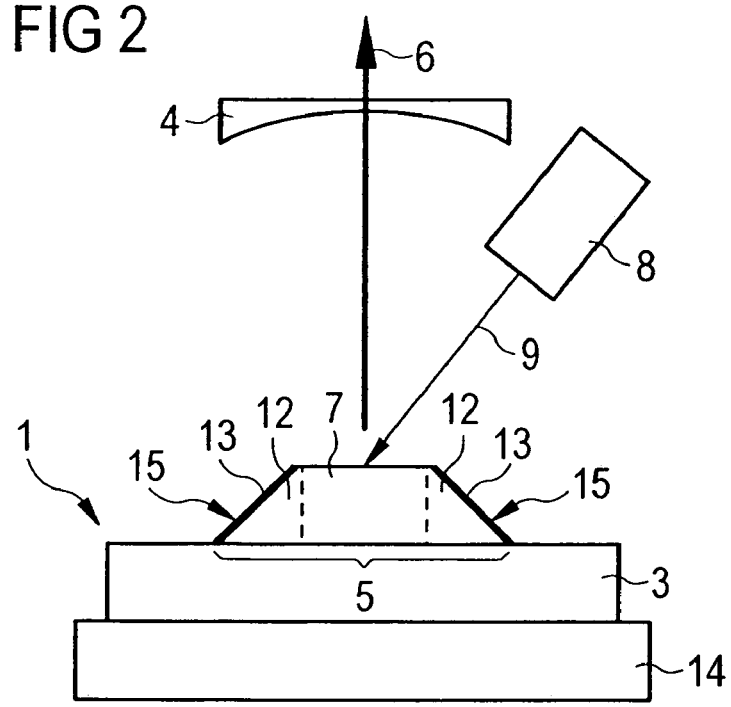
FIG. 2 shows a diagrammatic illustration of a cross section through a second example of the first embodiment of a semiconductor laser according to the invention.

The second example of the first embodiment of a semiconductor laser according to the invention as illustrated in FIG. 2 differs from that illustrated in FIG. 1 furthermore by virtue of the fact that the side walls 15 of the mesa run obliquely with respect to the main radiating direction 6 of the semiconductor laser. The oblique side walls 15 advantageously do not form a resonator and thus prevent a build-up of oscillations of the laser in a direction perpendicular to the main radiating direction 6. In this exemplary embodiment, too, the side walls 15 of the mesa are preferably provided with an antireflective layer 13.

The second embodiment of the invention, the aim of which is actually to reduce the production of the spontaneous emission, may be realized for example in the example illustrated in FIG. 5 by virtue of the fact that the side walls 11 of the mesa form a resonator which reduces the spontaneous emission in a direction perpendicular to the main radiating direction. In this embodiment of the invention, it may even be advantageous to provide the side walls 11 of the mesa with a reflection-increasing layer 16.

Figure 3A:
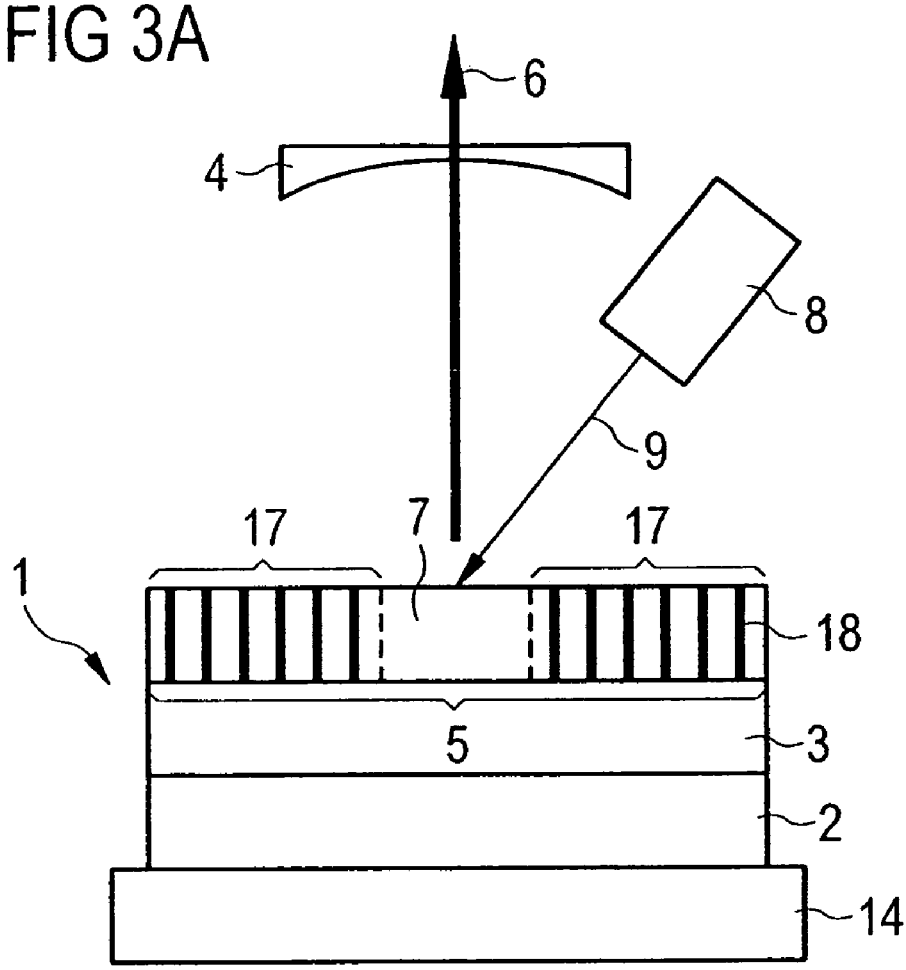
FIG. 3a shows a diagrammatic illustration of a cross section through a second example of a second exemplary embodiment of a semiconductor laser according to the invention.
Figure 3B:
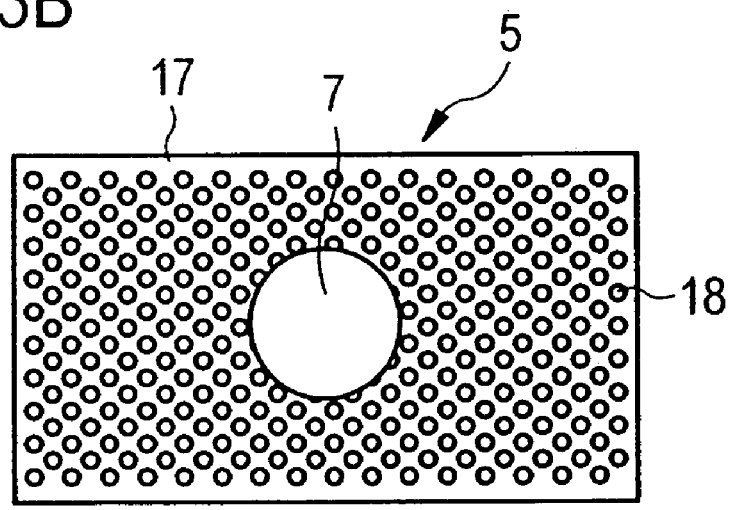
FIG. 3b shows a diagrammatic sectional view of the active layer of the third exemplary embodiment from above.

A second example of the second embodiment of the invention is illustrated in FIGS. 3a and 3b. Apart from the configuration of the active layer 5, the semiconductor laser illustrated in FIG. 3a corresponds to the semiconductor laser illustrated in FIG. 1. The active layer 5 is patterned in such a way that the optically pumped region 7, in a direction perpendicular to the main radiating direction 6 of the laser, is surrounded by a region 17 having a lattice structure that forms a photonic crystal in which radiation having the emission wavelength is not capable of propagation.

The lattice structure is realized for example by a region 17 of the active layer 5 that surrounds the optically pumped region 7 being provided with a periodic arrangement of cutouts 18. This is illustrated from above in the sectional view of the active layer 5 as illustrated in FIG. 3b. The cutouts 18 may also be filled by a material having a refractive index that differs from the refractive index of the surrounding semiconductor material.

Figure 4:
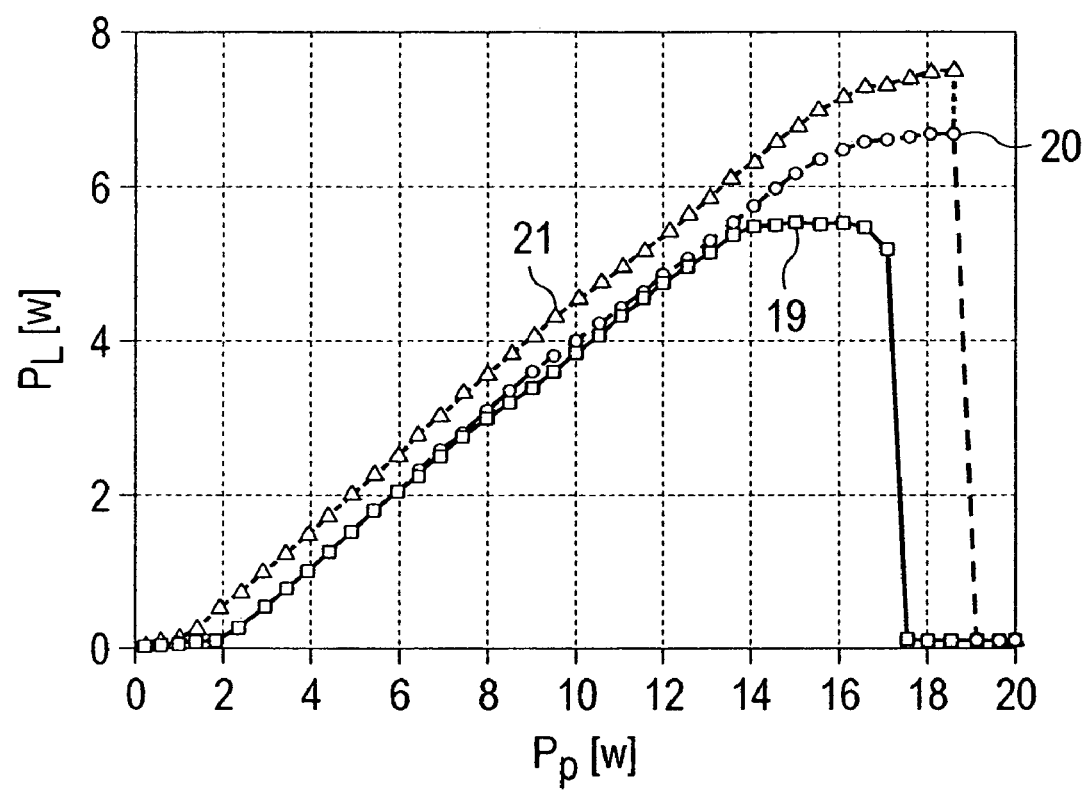
FIG. 4 shows a simulation of the output power of a semiconductor laser as a function of the pump power, the intensity and the coupling-out of the spontaneously emitted radiation having been varied.

The results of a simulation calculation as shown in FIG. 4 once again illustrate the fundamental idea of the two embodiments of the invention. The illustration shows simulations of the output power $P_L$ of a semiconductor laser as a function of the power of the pump radiation source $P_P$.

In the case of the simulation of the curve 19 illustrated with square symbols, it was assumed that spontaneously emitted radiation arising in the semiconductor laser is not coupled out. Given a pump power of above approximately 17 W, the semiconductor laser exhibits a severe dip in the output power on account of thermal overheating.

The curve 20 illustrated with circular symbols was simulated under the assumption that 50% of the spontaneously emitted radiation is coupled out from the semiconductor chip. This improved coupling-out of spontaneously emitted radiation corresponds to the basic idea of the first embodiment of the invention. The curve 20 illustrates that the output power does not dip until at a higher pump power and, therefore, it is also possible to achieve a higher output power.

The curve 21 illustrated with triangular symbols illustrates the principle of the second embodiment of the invention. In this simulation, it was assumed that although spontaneously emitted radiation is not coupled out from the semiconductor chip, the spontaneously emitted radiation is reduced overall by 50%. In this case, too, it is possible to achieve higher output powers than in the case of the curve 19. In the case of the simulated curve 21, given the same pump power, the output power of the semiconductor laser is greater than in the case of the curve 20 since the laser threshold is also lowered overall as a result of the reduction of the spontaneous emission. Therefore, the laser activity also already commences at a lower pump power.

The invention is not restricted by the description on the basis of the exemplary embodiments. Rather, the invention encompasses any new feature and also any combination of features, which in particular comprises any combination of features in the patent claims, even if this feature or this combination itself is not explicitly specified in the patent claims or exemplary embodiments.

I claim:

1. A semiconductor laser, comprising:
   a semiconductor chip comprising an active layer and emitting radiation in a main radiating direction;

wherein the active layer is structured in a direction perpendicular to the main radiating direction to reduce heating of the semiconductor chip by spontaneously emitted radiation;

wherein the active layer includes a region provided for optical pumping by a pump radiation source; and wherein the optically pumped region of the active layer is surrounded by a region having, in a direction perpendicular to the main radiating direction, a periodic structure that forms a photonic crystal in which radiation having the emission wavelength is not capable of propagation.

2. The semiconductor laser according to claim 1, wherein the semiconductor laser is a disc laser.

3. The semiconductor laser according to claim 2, wherein the disc laser has an external resonator.

4. The semiconductor laser according to claim 1, wherein the active layer has the form of a mesa.

5. The semiconductor laser according to claim 1, wherein the active layer has the form of a mesa, and the width of the mesa in a direction perpendicular to the main radiating direction of the semiconductor laser is approximately as large as the width of the optically pumped region.

6. The semiconductor laser according to claim 1, wherein the periodic structure is formed by a lattice-type arrangement of cutouts.

7. The semiconductor laser according to claim 6, wherein the cutouts are filled by a material having refractive index that differs from that of the active layer.

8. The semiconductor laser according to claim 1, wherein the laser contains a heat sink.

9. The semiconductor laser according to claim 8, wherein no substrate is contained between the heat sink and the active layer.

* * * * *